United States Patent
Wolberg et al.

(10) Patent No.: US 10,055,868 B2
(45) Date of Patent: Aug. 21, 2018

(54) METHOD OF RENDERING A MOSAIC DESIGN

(71) Applicants: George Wolberg, Woodmere, NY (US); Siavash Zokai, Jackson Heights, NY (US); Edward Acworth, Hamilton, MA (US); Michael Trachtman, Milton, MA (US)

(72) Inventors: George Wolberg, Woodmere, NY (US); Siavash Zokai, Jackson Heights, NY (US); Edward Acworth, Hamilton, MA (US); Michael Trachtman, Milton, MA (US)

(73) Assignee: Artaic, LLC, Boston, MA (US)

( * ) Notice: Subject to any disclaimer, the term of this patent is extended or adjusted under 35 U.S.C. 154(b) by 0 days.

(21) Appl. No.: 15/183,985

(22) Filed: Jun. 16, 2016

(65) Prior Publication Data

US 2017/0365082 A1 Dec. 21, 2017

(51) Int. Cl.
| | |
|---|---|
| *G06T 11/60* | (2006.01) |
| *G06T 17/20* | (2006.01) |
| *G06T 17/30* | (2006.01) |
| *G06T 7/00* | (2017.01) |
| *G06F 17/50* | (2006.01) |
| *G06T 11/40* | (2006.01) |

(52) U.S. Cl.
CPC .............. *G06T 11/60* (2013.01); *G06F 17/50* (2013.01); *G06T 7/0085* (2013.01); *G06T 11/40* (2013.01); *G06T 17/20* (2013.01); *G06T 17/205* (2013.01); *G06T 2207/10004* (2013.01)

(58) Field of Classification Search
CPC ........ G06F 17/205; G06F 17/20; G06F 11/40; G06F 17/50
USPC .......................................... 345/423, 619, 581
See application file for complete search history.

(56) References Cited

U.S. PATENT DOCUMENTS

| | | | |
|---|---|---|---|
| 6,476,809 B1 * | 11/2002 | Browne ................. | G06T 11/40 345/423 |
| 9,292,970 B2 * | 3/2016 | Gary ..................... | G06T 17/205 |
| 2007/0250197 A1 * | 10/2007 | Glass .................... | B44C 3/126 700/96 |
| 2007/0288860 A1 * | 12/2007 | Ording ................ | G06F 3/04842 715/779 |
| 2008/0101682 A1 * | 5/2008 | Blanford ............. | G01B 11/005 382/141 |

(Continued)

OTHER PUBLICATIONS

Gershon Elber, et al., "Rendering Traditional Mosaics", The Visual Computer, Mar. 2003, vol. 19, Issue 1, pp. 67-78.*

(Continued)

*Primary Examiner* — Jin-Cheng Wang
(74) *Attorney, Agent, or Firm* — Robert Schuler

(57) ABSTRACT

A vector based mosaic design system has a graphical processing module, a display module, a plugin application module and memory, and it operates to receive an original input image and mosaic design information from an artist. The plugin module has logical instructions that operate on the information received from the artist to determine the position of curves that are offset from a mosaic design region boundary or feature curve, and the plugin also operates to determine the positions and dimensions of tiles in courses that are defined by the positions of feature curves and curves that are offset from them.

16 Claims, 14 Drawing Sheets

(56) References Cited

U.S. PATENT DOCUMENTS

| | | | |
|---|---|---|---|
| 2013/0275089 A1* | 10/2013 | Gary | G06T 17/205 |
| | | | 703/1 |
| 2016/0125650 A1* | 5/2016 | Crocker | G06T 17/20 |
| | | | 345/423 |
| 2016/0196691 A1* | 7/2016 | Crocker | G06T 17/205 |
| | | | 345/423 |

OTHER PUBLICATIONS

Lars-Peter Fritzsche et al., "Interactive Design of Authentic Looking Mosaics using Voronoi Structures", In Proc. 2nd International Symposium on Voronoi Diagrams in Science and Engineering (VD), 2005, pp. 1-11.*

W. Hu, "Surface Mosaic Synthesis with Irregular Tiles", HKU CS Tech Report TR-2015-05, May 2005, pp. 1-11.*

* cited by examiner

RANDOM RESAMPLING & JITTER

(1) INPUT FEATURE CURVE
(2) RESAMPLED CURVE (1/10 OF TILE SIZE)
(3) ADAPTIVE SAMPLING

FIG. 8A (FEATURE CURVE 800)
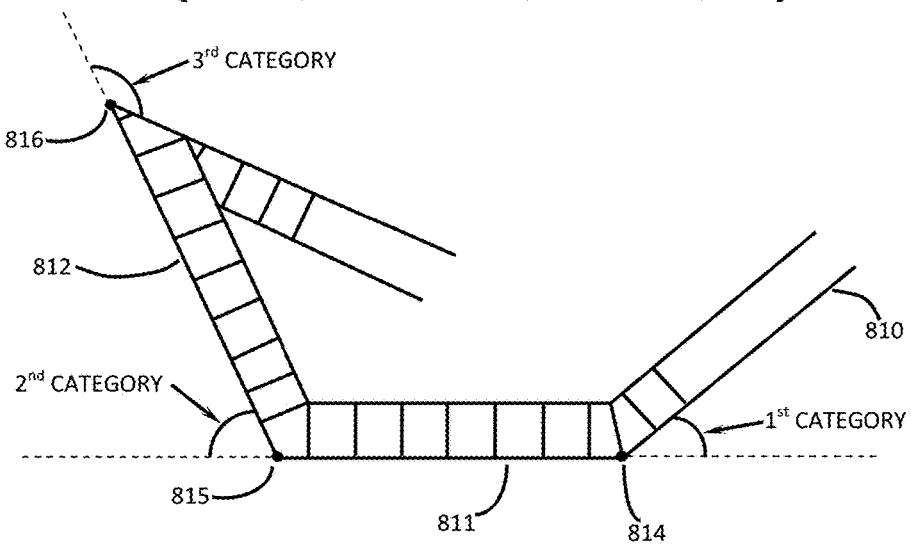
FIG. 8B
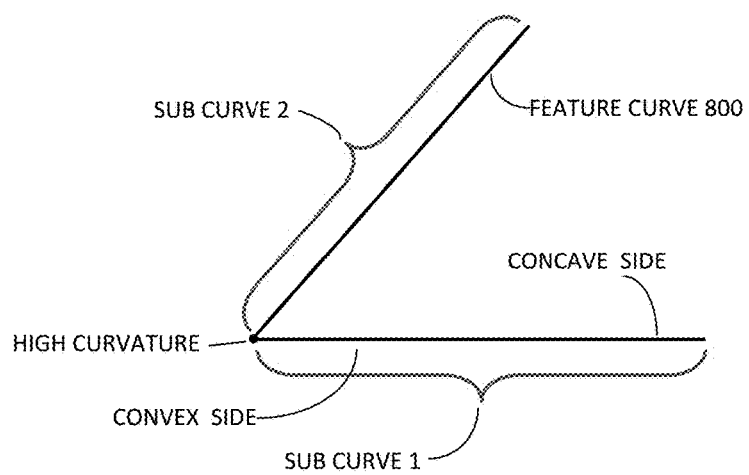

METHOD OF RENDERING A MOSAIC DESIGN

FIELD OF THE INVENTION

The present disclosure relates to a computer application that operates to place individual tiles in a mosaic design.

BACKGROUND

Classical mosaic art is a great source of visual splendor dating back to ancient Greece and Rome. The impact of this art form remains enduring as mosaics continue to adorn large public spaces and add beautiful accents to private homes. Today, this ancient art remains a heavily labor-intensive exercise in both design and construction. It has stubbornly resisted automation, adding considerable cost to any project limiting its usage. Conditions are now suitable for introducing robotics and software tools to design, render, and manufacture mosaic artwork.

Typically, a mosaic design is based upon a pre-existing image, or an image that is created by an artist specifically for the mosaic design. Regardless, mosaic design applications or systems are available that automate portions or substantially all of the mosaic design process. The functional elements of such a mosaic design system 5 are shown in FIG. 1A. A mosaic designer can use the mosaic design system to assist with laying out individual mosaic tiles in a grid or free-form style that is a reasonable facsimile of the original image. The mosaic design system can automate certain steps of the mosaic creation process and can support manual intervention by the designer in the mosaic creation process.

Existing mosaic design systems are known that can operate using a two phase mosaic design process, in which the first phase requires the user to draw region boundaries and feature curves. Region boundaries segment the image into disjoint areas, and feature curves govern the tile flow in each region. The second phase then packs tiles along courses that run parallel to the feature curves. More specifically with reference to FIG. 1B, the process begins with the mosaic design system user drawing region boundary curves to segment the image into closed regions. The user can then draw one or more feature curves (shown in FIG. 1C) in each region to highlight a prominent feature that will define the flow, or andamento, within that area. Equidistant flow lines that run parallel to the feature curves are generated (FIG. 1D). The areas alongside the flow lines are courses that are then tiled (FIG. 1E) to form the mosaic geometry. Notice that the region boundaries serve to clip that region's flow lines so that the tile flow in one region can be independent of that in another. The region boundaries and feature curves are represented by Bézier curves that are drawn directly on a displayed image. Segmentation is accomplished by drawing the boundary curves in an off-screen image buffer as black cubic Bézier curves on a white background and extracting the connected components from the resulting image.

The mosaic design system 5 described above operates in a batch mode and employs an image-based distance transform algorithm to compute the set of parallel rows (i.e., flow lines) that lie about each feature curve. Prior to the system 5 calculating the position of any tile in a course, all of the region boundary and feature curves have to be placed in the mosaic image (first phase), and then the system operates to calculate the positions of all the tiles in each tile course as defined by the region boundary and feature curves (second phase) and then displays all of the tiles at once. For each pixel in the image, the algorithm computes a distance between that pixel and the closest point on a feature curve. By quantizing the resulting distance transform using the tile size, equidistant rows are derived that will be packed with tiles. This is accomplished by first creating an empty (white) image with an aspect ratio equal to that of the output mosaic and then drawing the region's feature curves in black. The distance transform of the image is calculated, quantized, and level sets are extracted that form the course boundaries. The number of quantization levels in the distance transform is a function of the tile size requested by the user.

BRIEF DESCRIPTION OF THE DRAWINGS

FIG. 8A illustrates how an angled feature curve 800 can be tiled.

FIG. 81B shows labeled component parts of an angled feature curve.

DETAILED DESCRIPTION OF THE DRAWINGS

Figure 1A:
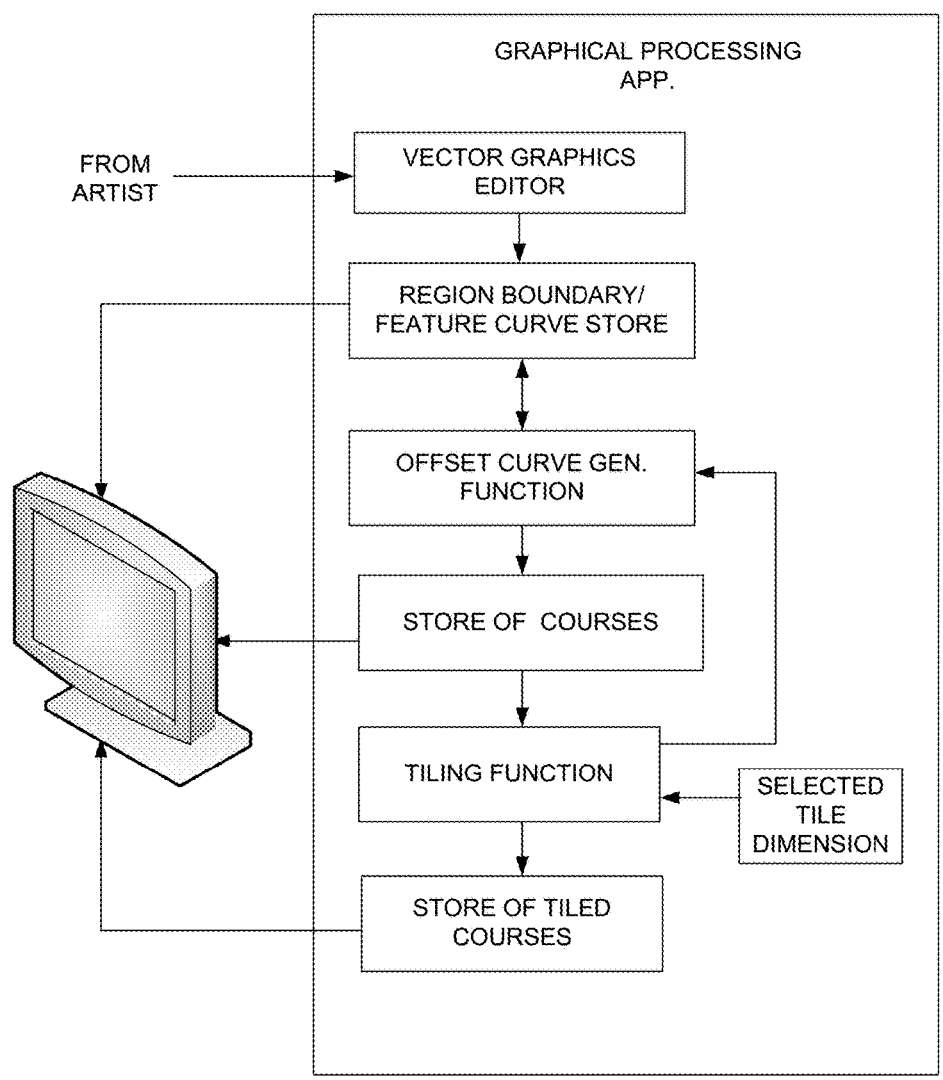
FIG. 1A is a diagram of a mosaic design system 5.
Figure 1B:
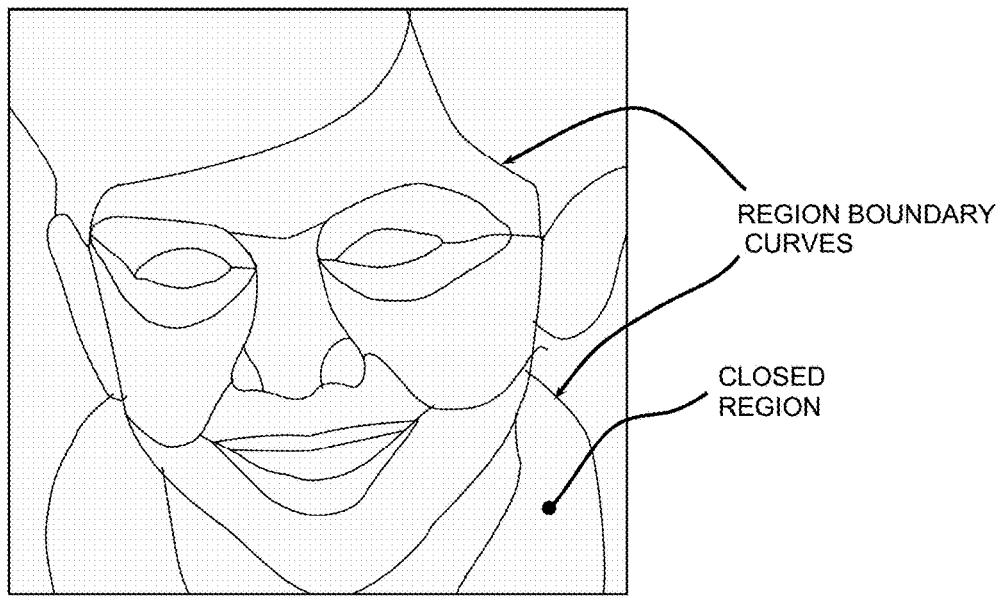
FIG. 1B is a diagram showing an image with region boundary curves added.
Figure 1C:
FIG. 1C is a diagram showing the image of FIG. 1B with feature curves added.
Figure 1D:
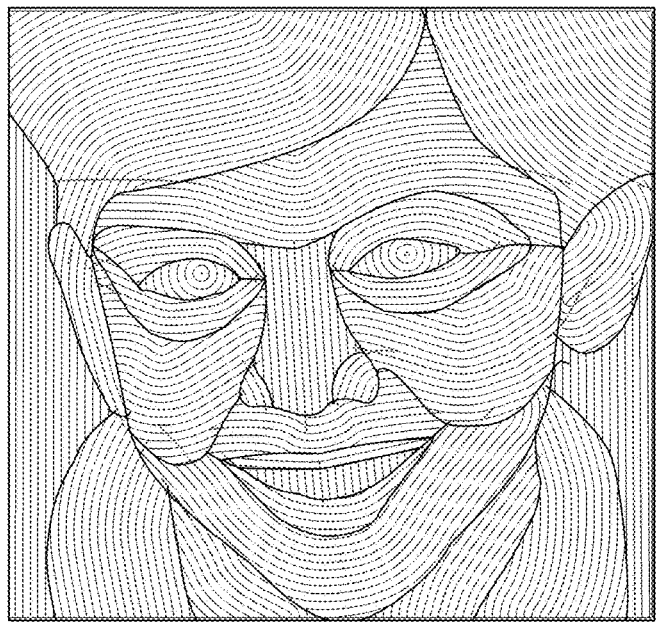
FIG. 1D is a diagram showing the image similar to FIG. 1C with flow lines that run parallel to feature curves. The area between a pair of flow lines is referred to as a course.
Figure 1E:
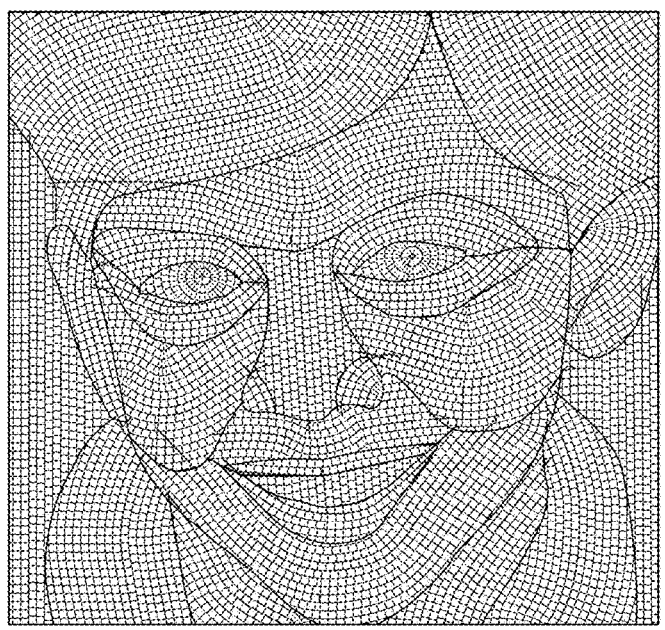
FIG. 1E is a diagram showing the image of FIG. 1D with tiled courses.

Image-based mosaic design systems are limited by the resolution or size of a buffer employed to store information associated with a mosaic design being created. For large mosaic designs, this buffer necessarily has to be very large. This leads to implementations that are memory-intensive and plagued by slow performance. One solution to this problem is to reduce image resolution in order to reduce the memory used and to speed image processing. But this solution has the undesirable consequence of sacrificing image accuracy.

The resolution of an image used to compute the distance transform determines the accuracy of the distance computations, and has a corresponding effect on the quality of extracted courses and tiles in the final mosaic. The constraint on the minimum resolution of images in the computations imposes a limit on the maximum physical size of the mosaics that can be generated by such a mosaic design system. While the flow within a region remains consistent with the specified feature curve, image-based mosaic design systems introduce visible discontinuities in the flow between regions. Although it is natural for a row of tiles in one region to collide with a neighboring row of tiles in an adjacent region, a visually perceptible seam appears when many parallel rows lie on each side of this interface. This problem is exacerbated by the ease with which a user can spawn many parallel rows from a single feature curve. One method of resolving this problem is to inject additional regions to soften the transition among region flow lines. It is difficult, however, for a user to anticipate the optimal layout of regions and their feature curves over an entire mosaic design, particularly if the dimensions of the design are relatively large. Further, while image-based mosaic design systems have been demonstrated to be effective in assisting the user to reverse engineer an existing mosaic, the image-based systems tend to operate in what is essentially a batch-processing mode, where all parallel rows in a region are generated at once. Artists don't tend to think in terms of a complete partitioning of the image into closed regions filled with a complete set of parallel rows, but rather they generate a mosaic design in a gradual, incremental manner.

In lieu of the limitations of image-based mosaic design systems, it is preferable that a mosaic design system allows a mosaic artist to take a more incremental approach to mosaic design that allows the artist to organically grow the mosaic one step at a time. Accordingly, we have designed a novel mosaic design system that allows a user to interactively lay down tiles while conforming to conventional mosaic design rules. This novel mosaic design system facilitates the incremental creation of a mosaic design by allowing a user/artist to enter a feature curve into the system, and at substantially the same time that the feature curve is entered, the system calculates the position of a curve that is offset from the feature curve by a selected tile width, and then populates the area (course) between the feature curve and the offset curve with tiles. In this manner, one or more feature curves can be drawn or entered into the system by the artist, and the artist can select one or more of the feature curves along which tiles can be positioned and displayed by the system. Using such a system, the artist can move a cursor to either side of the selected feature curve to spawn additional curves that are offset from the selected feature curve by some selected distance. As the system determines a position for an offset curve to the selected feature curve, the offset curve can be displayed and a resulting course can be populated with mosaic tiles.

Figure 1F:
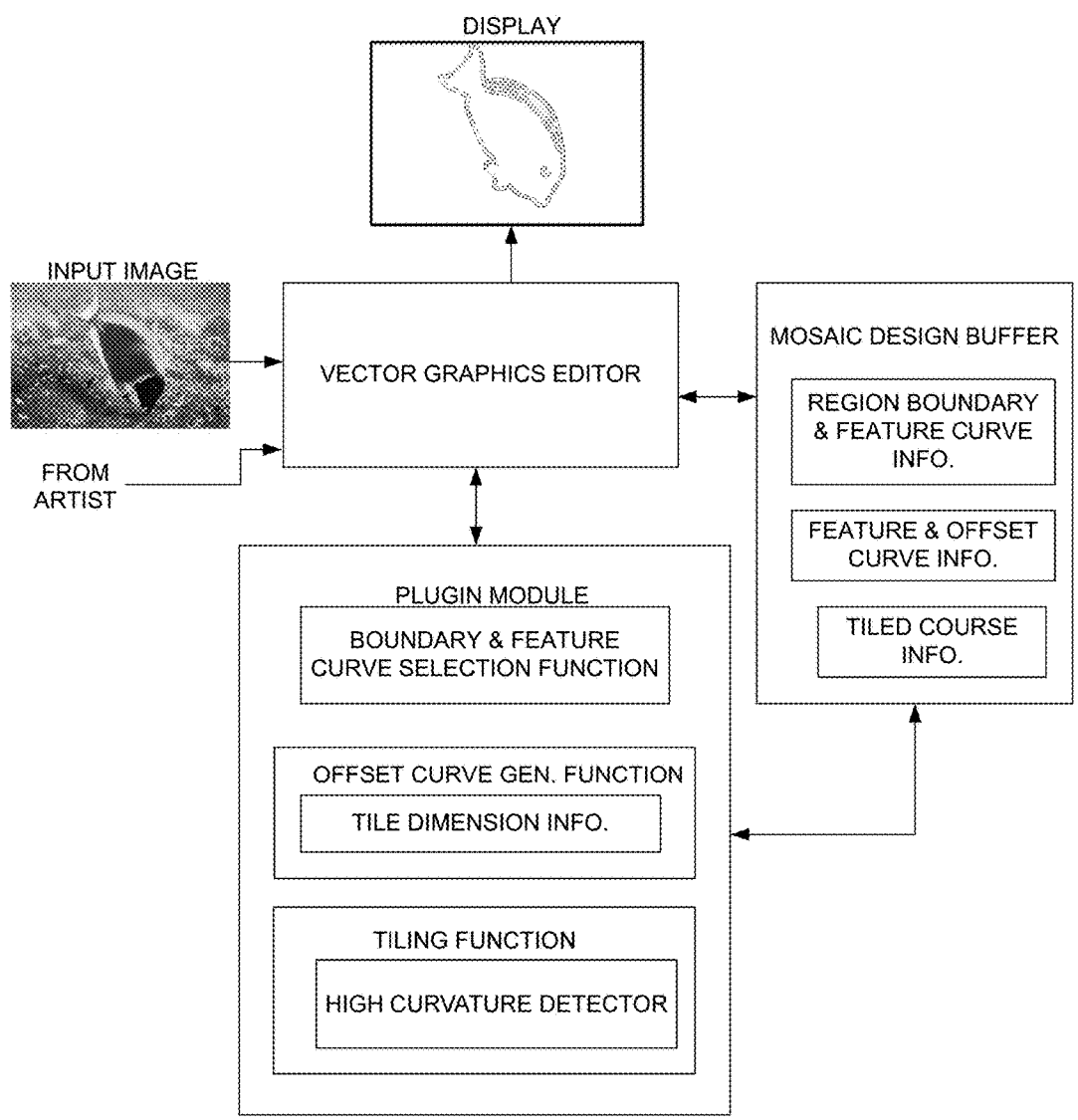
FIG. 1F is a diagram showing the functional blocks comprising a vector based mosaic design system 10.

These and other advantages of the vector based mosaic design system, hereinafter referred to simply as the System 10, are described with reference to the following figures, wherein FIG. 1F is a diagram showing functional blocks comprising the System 10. The System 10 can be comprised of an image input means (scanner or other image capture device, such as a camera for instance) for entering an original image into the System 10, a device for displaying the output of a graphical processing module (i.e., 2-D vector drawing computer program), which generally operates on information received from an artist that corresponds to region boundary and feature curve information and other instructions. The System 10 can also be comprised of a plugin module and a mosaic design buffer module. The plugin module is a special purpose computer application that generally operates, in conjunction with the graphical processing module, to receive region boundary and feature curve information, and to use logical computer instructions to generate offset curves that define courses that are then tiled. The graphical processing module can be any commercially available 2-D vector drawing computer program, such as the Adobe Illustrator, Inkscape, or Sketchup products. The mosaic design buffer serves as a store of information that can be used by the plugin module to generate offset curves and to calculate the positions of tiles in a course, and the buffer serves to store the output of the plugin module which can then be viewed on the display by the artist. The operation of the System 10 to generate offset curves, and to tile courses is described below in more detail with reference to the corresponding figures.

Figure 1G:
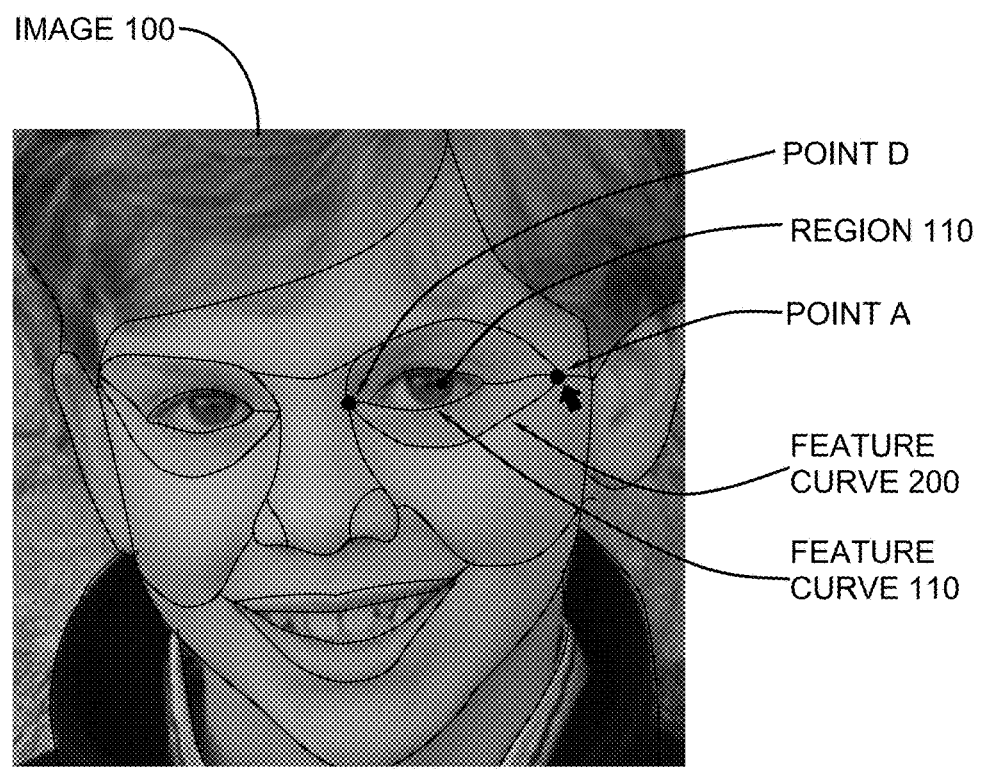
FIG. 1G is an input image with selected region boundaries that are used as feature curves.

FIG. 1G shows an original input image 100 from which a mosaic design can be created. The image is shown to have a number of feature curves, and one of the feature curves starting at Point A and ending at Point D is labeled 200. The image 100 can be displayed by the System 10 for viewing by a mosaic artist via any appropriate graphical user interface, such as the GUI in FIG. 1F. According to a first embodiment, and subsequent to drawing the region boundary and feature curves, the mosaic artist selects a region (using a cursor, for instance) and then selects that region's boundary curve or a feature curve lying within that region. In either case, the selected curve is now referred to as the feature curve for the subsequent courses that will be generated within that region. More specifically, feature curve selection presents the mosaic artist with three options. Option A permits the artist to select the entire feature curve, Option B permits the artist to break the curve into segments based upon high curvature points, and the artist can select any one of the curve segments, and Option C permits the artist to manually select start and end points on the feature curve to define a segment. This curve selection operation can be repeated as often as necessary by the artist in order to adequately identify regions in the image 100 that are to be tiled. In this regard, a feature curve can define/circumscribe an entire image region, such as the eye region 110 defined by a feature curve 110 (closed feature curve), or a feature curve can define a portion of a region (open feature curve) such as the feature curve 200.

After at least one feature/boundary curve is entered into the System 10, the mosaic artist can initialize the offset curve generation function, described earlier with reference to FIG. 1F, by selecting a feature curve previously entered, and moving a cursor away to either side of the selected feature curve. An additional feature curve is generated by the System as the cursor is moved a specified distance from the selected feature curve. This second feature curve is generally referred to as an offset curve with respect to the feature curve selected by the mosaic artist. After the System determines a location of the offset curve, it can then initialize a tiling function to calculate the location of one or more mosaic tiles that are to be positioned in the course area that lies between the selected feature curve and the associated offset curve.

Figure 2A:
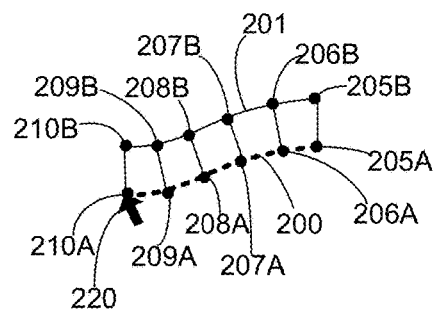
FIGS. 2A, 2B and 2C illustrate the progressive construction of a tiled course.
Figure 2B:
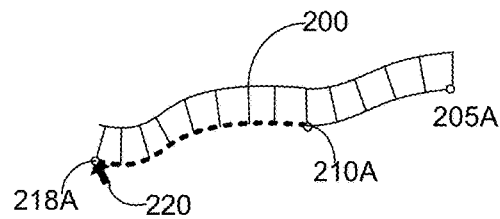
Figure 2C:
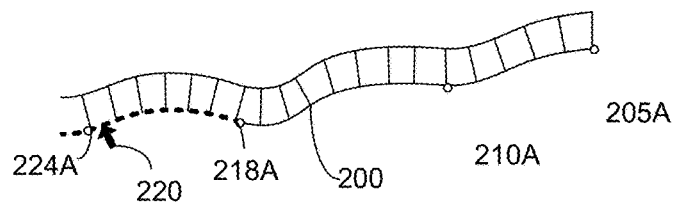

According to a second embodiment, a feature curve can be drawn, the position of an offset curve can be determined and the tiling operation can be performed by the System 10 at substantially the same time. In this regard, FIGS. 2A to 2C illustrate the operation of the System 10 to progressively tile a course along the feature curve 200 as it is being drawn. FIG. 2A illustrates a tiling operation by the System 10 along a portion of the feature curve 200 that is drawn between points 205A to 210A. This portion of the feature curve 200 is illustrated by a dashed line that connects the points 205A and 210A located at a proximal and a distal end of the feature curve 200 respectively. A portion of an offset curve 201 (with respect to the feature curve 200 portion) is illustrated to be generated by the System 10 at the same time at the feature curve is drawn, and both the feature and the offset curves have vertices that represent points on the curves that are intersected by line segments that are normal to the curves. In this regard, the feature curve has vertices 205A to 210A, and offset curve 201 has vertices 205B to 210B. The line segments are represented in the Figure by the numbered pairs 205A/205B, 206A/206B and so forth. Each line segment that is normal to the curves can represent a tile edge location (plus any grout area) along a tile course which is the area between the curves 200 and 201. As a cursor labeled 220 is moved along features in the image 100, the System 10 detects this movement and generates a feature curve that is viewable by the mosaic artist. FIGS. 2B and 2C illustrate an incremental continuation of the feature curve drawn by the mosaic artist, the generation by the System 10 of the associated offset curve and tile positions in the course.

Figure 3A:
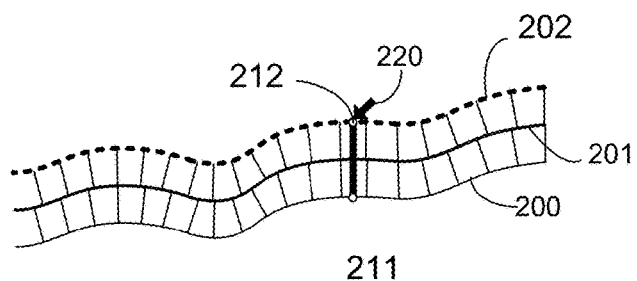
FIGS. 3A and 3B illustrate the progressive construction of offset tiled courses.
Figure 3B:
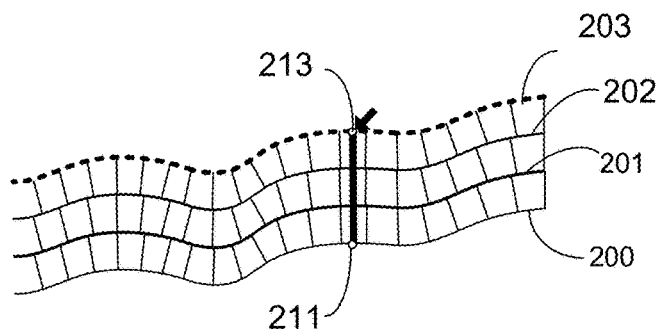

When the mosaic artist determines that their drawing of the feature curve 200 is completed (in FIG. 2C), they can move the cursor 220 away from the curve (in either direction as illustrated in FIG. 3A) in order to generate additional curves that are offset from the selected feature curve. In this regard, FIG. 3A illustrates the cursor 220 being moved from a position 211 to a position 212 away from the feature curve 200, and it shows an additional offset curve 202 being displayed and the course between the offset curves 201 and 202 being populated with mosaic tiles. More specifically, after the cursor 220 is moved a selected distance (i.e., one or more tile widths) from the offset curve 201, a location of the offset curve 202, the locations of the vertices along the curve, and the line segment locations are determined, so that a course populated with tiles can be displayed. FIG. 3B shows that an additional tile course is generated and displayed by the System 10 when the cursor 220 is moved from the position 212 on the curve 202 to a position 213 on a newly displayed offset curve 203. In this manner, the System 10 allows the mosaic artist to observe the effect of drawing a feature curve as the curve is being drawn.

Figure 4:
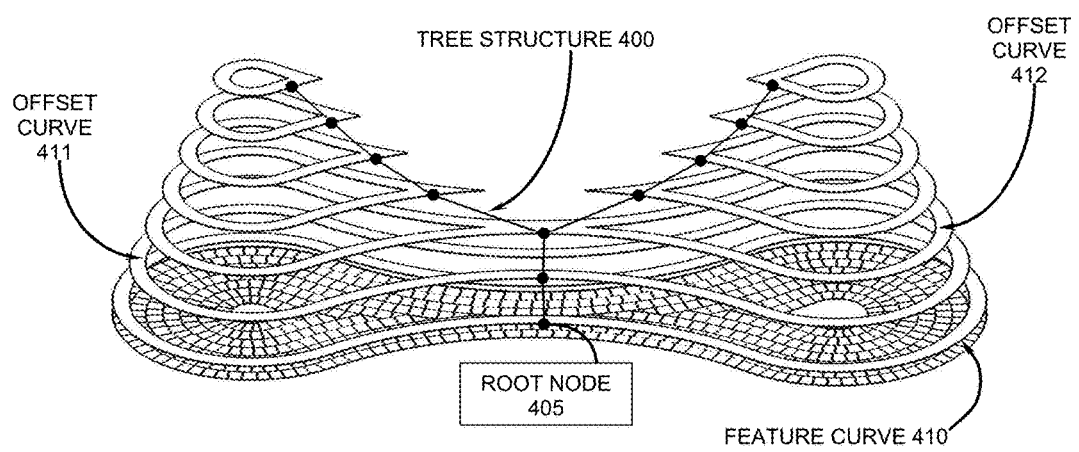
FIG. 4 is an illustration of a tree structure 400 used to store feature curve, offset curve and tile information.

Each feature curve that is entered into the System 10 by the artist can be selected and then stored in a structure (such as a tree structure) maintained in the mosaic design buffer, where a feature curve drawn to define a region can be a root node of the tree structure. Once selected, a cursor can be moved away from a feature curve which causes the tiling function to tile the feature curve. The distance the cursor moves away from the feature curve is measured, and if the measured distance is greater than a selected tile size (plus any allowance for grouting), the positions of one or more offset curves are calculated and placed into different levels in the tree structure. FIG. 4 depicts such a tree structure 400 having a closed feature curve 410 at a root node, and which branches into two closed offset curves 411 and 412. After all curves are entered into the System 10, the tree structure 400 is traversed in breadth-first manner to identify all nodes/curves in the tree and to place the nodes into a list. Information comprising an offset curve associated with each node in the tree is examined to determine whether it is terminated or not, and if so the terminated offset curve is removed from the structure. An offset curve is considered to be terminated if the length of the curve is smaller than the tile size or if the offset curve is fully outside of a region with which it is associated. When the last curve in the list has been examined, the process of tiling courses ends. One benefit of storing feature and offset curves and the position of tiles in the courses between the curves in the tree structure 400 is for ease of tracking the branches of the offset curves. The process of tiling a course using the System 10 is interactive, and an artist can be allowed to move the cursor back and forth to find the desired artistic look before committing to a design and permanently storing the final rows of tiles. Use of the tree structure allows the System 10 to store the calculated positions of tiles and to display them interactively as the artist moves the cursor around.

Figure 5:
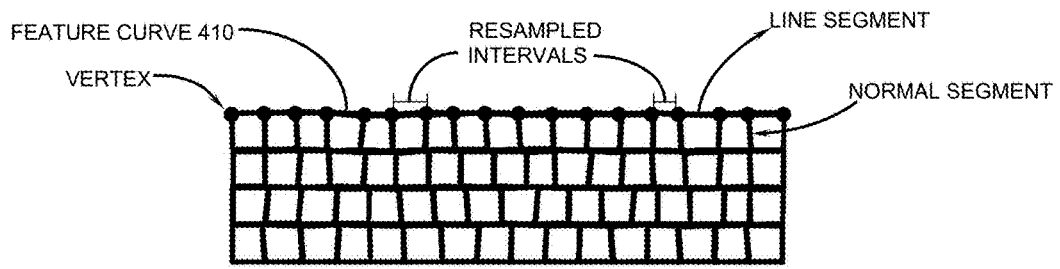
FIG. 5 is an illustration of several tiled courses showing several feature curves, their resampled intervals and line segments.
Figure 6A:
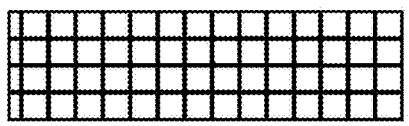
FIG. 6A illustrates several tiled courses with partial tiles at the end of a course.
Figure 6B:
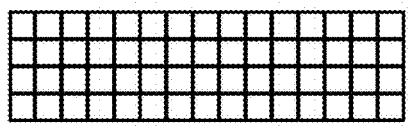
FIG. 6B illustrates a resulting set of courses after the partial tiles are removed.

As a course of tiles is being created, the tiling function in the plugin module described in FIG. 1F can operate to detect high curvature or corner points along a feature curve. If the curve does not have any corners, we place tiles along the curve, jittering their widths as well as the direction of the line segments that are normal to the feature curve for added realism. Furthermore, the tile sizes adaptively change based on the curvature. Low curvature results in the positioning of tiles having a default tile size that was initially selected by the artist. Those portions of the feature curve having higher curvature results in positioning a reduced-sized tile, whereby at least one dimension is smaller than the default tile size. This permits the tiles to more closely follow the shape of a curve. Additionally, the System 10 tiling function can calculate an optimized tile size so that a tile course does not end in a partial tile. The process is described below with reference to FIGS. 5, 6 and 7 below.

In order to determine the position of vertices (and therefore the position of tiles in a course) along all or a portion of a selected feature curve, the plugin module resamples the feature curve 410 at random, irregular intervals to randomly vary the line segment lengths, which adds an element of realism to a mosaic, simulating a hand-cut tile appearance. In this regard, the plugin module can operate to resample the feature curve at selected/predetermined/programmed intervals, the distance of which can be regular (one tile width), or the distance of which can be randomly irregular which can be calculated by randomly resampling the feature curve between [0.9× Δ, Δ], where Δ=(tile width+grout width). Each of the resample intervals is bounded by a vertex point. The plugin module can also operate to randomly jitter the direction of line segments that are normal to a feature curve by ±5°. The combination of the irregular resampling and jittering add the hand-cut tile appearance to a mosaic as illustrated with reference to FIG. 5. In the event that the last tile at the end of a course is less than half a tile size (partial tile), the plugin module can operate to eliminate the partial tile and to evenly distribute the space previously occupied by the partial tile to each remaining tile in the course. This is shown with reference to FIGS. 6A and 6B.

Figure 7:
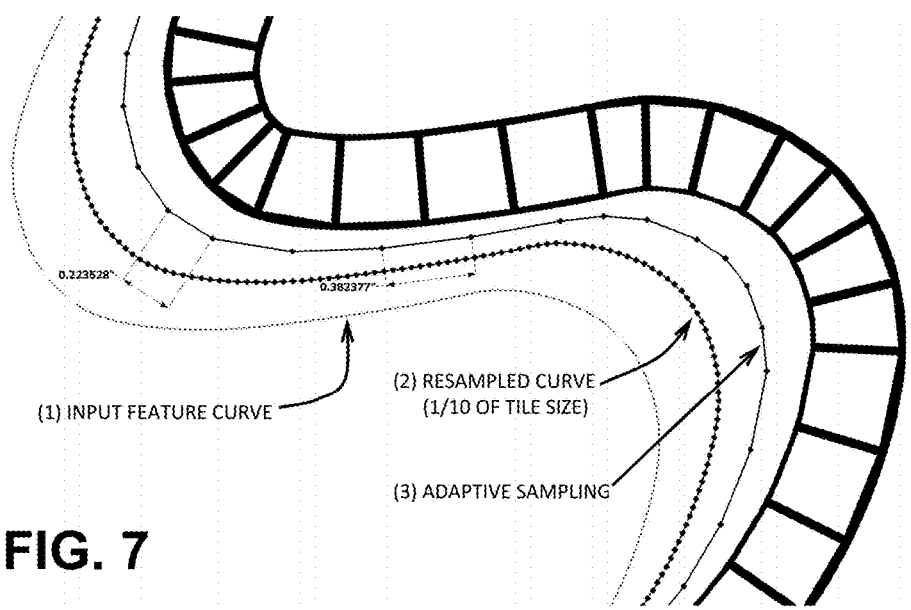
FIG. 7 is an illustration showing the tiling of a curved course after adaptive resampling.

In the event that all or a portion of a feature curve is not a straight line, the System 10 operates, as illustrated in FIG. 7, to resample the curve in an adaptive manner and to calculate a smaller tile width so that the tile can smoothly follow the portion of the feature curve according to the value of the curvature. In this case, the System 10 can operate to resample the curve at regular intervals (e.g., Δ/10). Then, the system multiplies these distances by a set of weights that are determined by the local curvature of the feature curve. Therefore, when a portion of the feature curve is a straight line, the weight used to multiply the distance can be one (1). The weight can be proportionately higher as the curvature increases. Then, from the beginning of the curve, the System 10 adds the calculated, weighted distances until the sum is greater than the tile size (Δ), and the position of the vertices is recorded and passed to the tiling function. The tile dimensions resulting from the System 10 are now varying, as shown in FIG. 7.

As described earlier, the System 10 can operate to tile a feature curve that is substantially straight or that has a smooth curvature. The System 10 can also operate to tile a portion of a feature curve that is determined to have a high curvature. The high curvature points on a feature curve can be associated with a plurality of high curvature categories. Three such categories are described here, but more than three categories can be maintained by the System 10. A first category is associated with a feature curve in which the angle between two adjacent segments is greater than or equal to 45° and less than or equal to 70° (i.e., 45°≤α≤) 70°, a second category is associated with a feature curve in which the angle between two adjacent segments is greater than or equal to 70° and less than or equal to 100° (i.e., 70°≤α≤) 100°, and a third category is associated with a feature curve in which the angle between two adjacent segments is greater than 100° (i.e., α≥100°). The range of angles assigned to any one of these categories can be selected/set by a System 10 administrator or user, and these ranges are only defined here for the purpose of this description. Examples of each of the three categories of feature curve segments described above are shown with reference to FIG. 8A. Subsequent to identifying a high curvature feature curve portion comprising a feature curve 800, and quantifying its angle, the identified curve portion is associated with one of the three high curvature feature curve categories. The System 10 then operates to place an appropriately shaped tile on the points along the curve 800 labeled, 814, 815 and 816 in FIG. 8A.

Figure 8C:
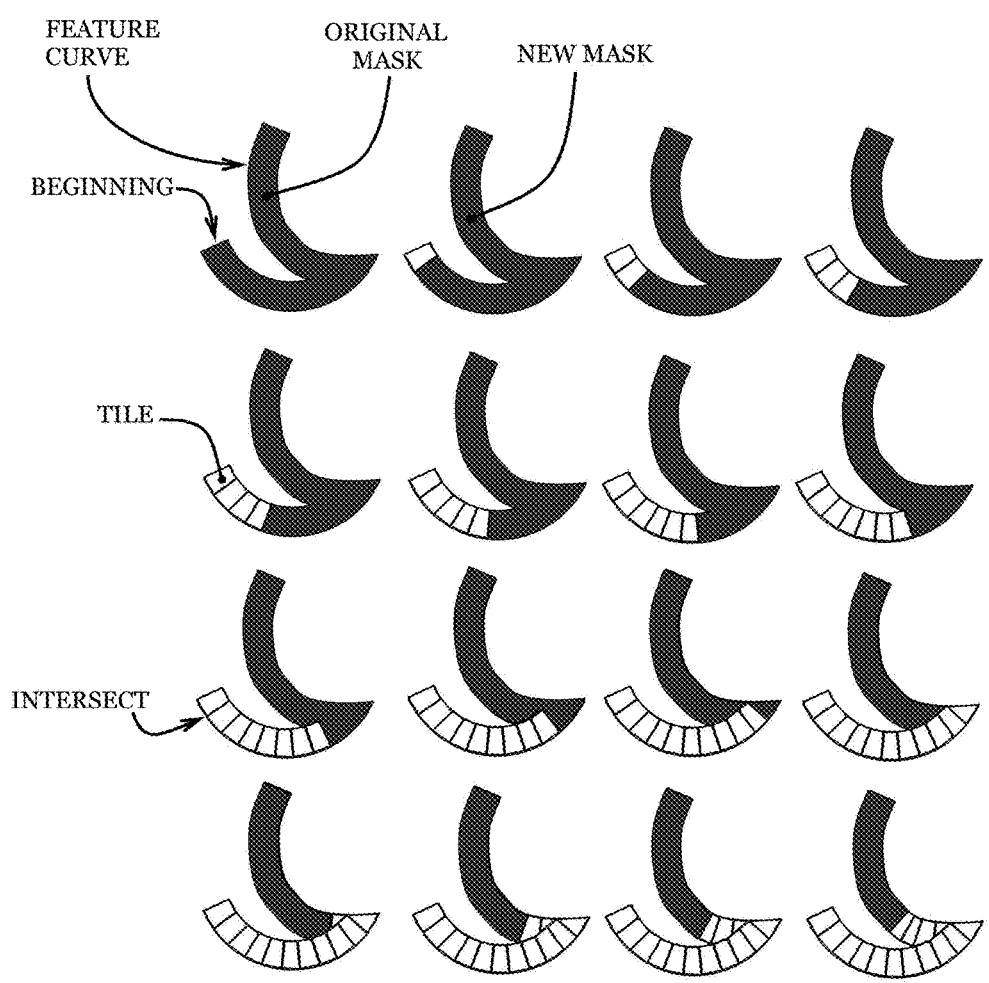
FIG. 8C illustrates a step-wise process for laying tiles in a course.

As described above, when a feature curve or region boundary is not smooth and has points of high curvature, the System 10 operates to detect these high curvature points and to segment a feature curve (curve 800 in this case) that is proximate to the high curvature point into smaller, smooth sub curves. FIG. 8A shows the feature curve 800 having three such high curvature points at 814, 815 and 816. After detecting the high curvature points, the System 10 can divide the curve into two sub curves, sub-curve 1 and subcurve 2 (shown in FIG. 8B), and assuming that the System 10 operates on a convex side of the feature curve to determine tile positions, each subcurve is tiled according to the method for tiling a smooth feature curve described earlier with reference to FIGS. 5, 6, and 7. Then, as shown with reference to FIG. 8C, starting from the beginning of the feature curve, we intersect every tile with the course polygon and subtract that tile from the course polygon. The resulting course will be used as a new mask for the next tile. We iterate this process for all remaining tiles and the mask gets smaller with each iteration.

Figure 9A:
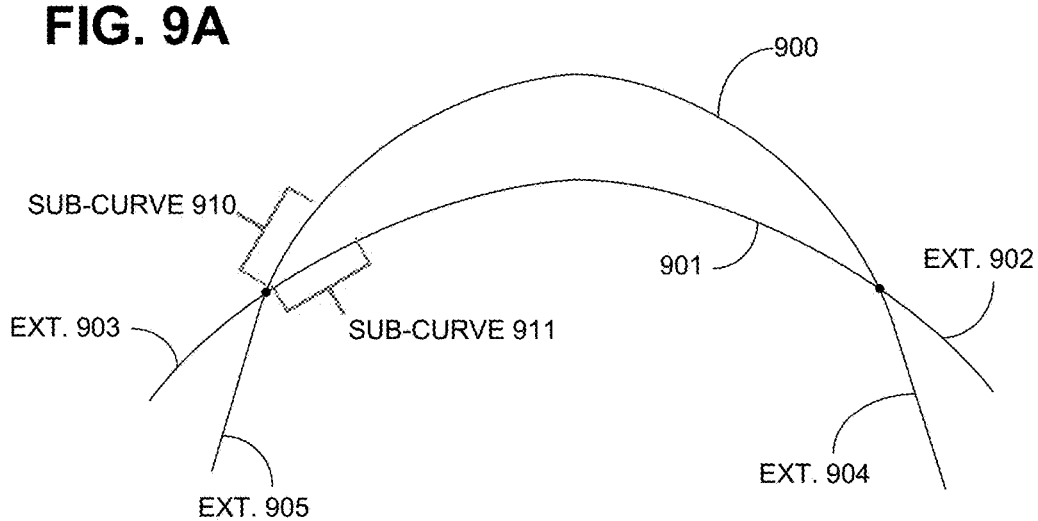
FIGS. 9A and 9B illustrate how to tile based upon a concave side of a feature curve.
Figure 9B:
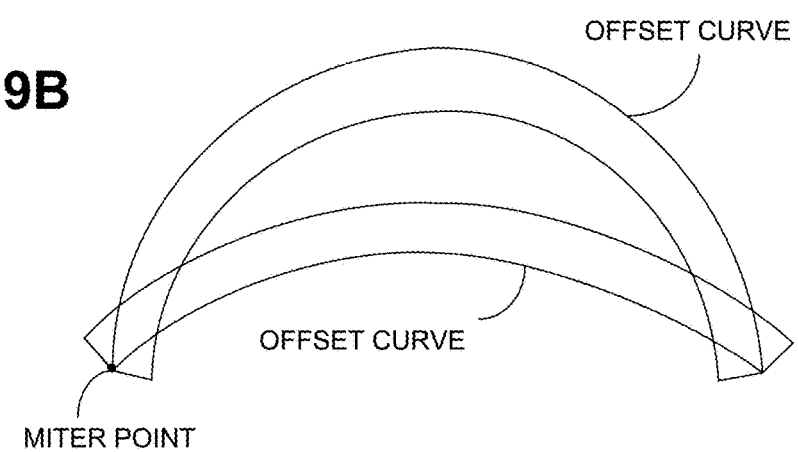

Alternatively, if the tiling operation is performed based upon the concave side of a feature curve, the System 10 can operate to extend detected sub-curves, to an intersection or miter point of the curve that is offset from the subcurves. In this regard, FIG. 9A shows two subcurves, labeled 910 and 911 with respect to the two feature curves 900 and 901 respectively. Extensions to the curve 900 are labeled 904 and 905, and extensions to the curve 901 are labeled 902 and 903. The System 10 then operates to tile the courses between the feature curves and the offset curves as described earlier, as shown with reference to FIG. 9B. The store of offset curve information permits the System 10 user to design a mosaic with sharp corners or with rounded corners from one course of tiles to an adjacent course.

The logical operation of the System 10 to tile a closed polygon region will now be described as follows with reference to FIGS. 10A, 10B and 10C. The logic described with reference to these figures is designed from the perspective that the tiling of a course does not occur until after an offset curve is generated by dragging a cursor to either side of a feature curve. However, it should be understood that in one embodiment, the System 10 can operate to generate offset curves without the need of an artist dragging a cursor to one or the other sides of a feature curve. Further, it should be understood that, although not explicitly described with reference to the associated figures, region boundary curve information, feature curve information, offset curve information, course information and information associated with the position, geometric shape and dimensions of tile comprising each course can be stored in the structure stored in the mosaic design buffer described with reference to FIG. 1F. Any or all of this information can be displayed to be viewed by the artist at the time that they enter their selections into the System 10. Any of the curve or tiling information stored in this buffer can be easily removed by the artist de-selecting any of this information, and the de-selection of this information can be immediately displayed for the artist to view. Operating in this manner, the System 10 allows the artist to engage in a natural, interactive mosaic design experience, all of which results in a more effective design process.

Figure 10A:
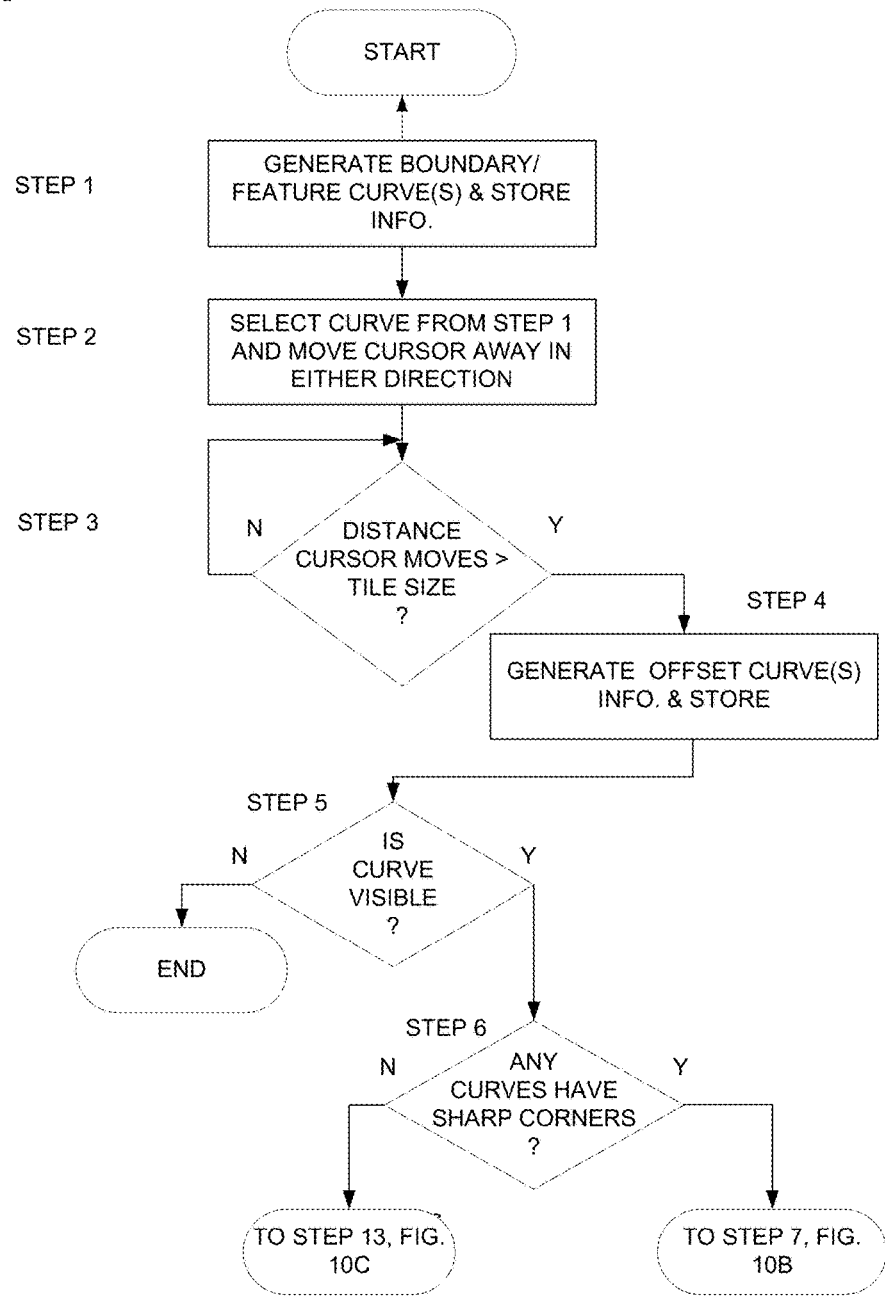
FIGS. 10A, 10B and 10C are a logical flow diagram of the process employed by the mosaic design system 10 to locate the position of tiles in a mosaic design.

Referring now to FIG. 10A, in Step 1 selected region boundary (closed polygon) information is entered into the System 10 via the GUI by an artist. The artist can enter this information into the System 10 in a number of different ways, one of which can be selecting the feature curve function (FIG. 1F) and moving a cursor along (tracing) a feature of an input image. Information associated with one or more than one regions can be entered at this time, and the same function can be used to select feature curves. Subsequent to entering information for at least one closed polygon region and any selected feature curves, in Step 2 the offset curve generation function (FIG. 1F) can be selected, and in Step 3 the cursor can be moved away, in either direction, from a selected one of the region boundary or feature curves generated in Step 1 to in Step 4 generate information associated with the position of one or more offset curves. Specifically, the offset curve generation function uses information in the tile dimension information store (FIG. 1F) to determine the location of an offset curve. If the cursor is moved more than a specified (stored tile dimension) distance from a region boundary or feature curve, than the plugin module generates offset curve information that is stored in the design buffer. If in Step 5 the offset curve lies entirely outside the region boundary, or entirely within one tile, then the offset curve generation process terminates. In Step 6 the plugin module can determine whether the curve generated in Steps 1 to 4 has sharp angles or corners, and if so then the process proceeds to Step 7 in FIG. 10B, otherwise the process proceeds to Step 13 in FIG. 10C.

Figure 10B:
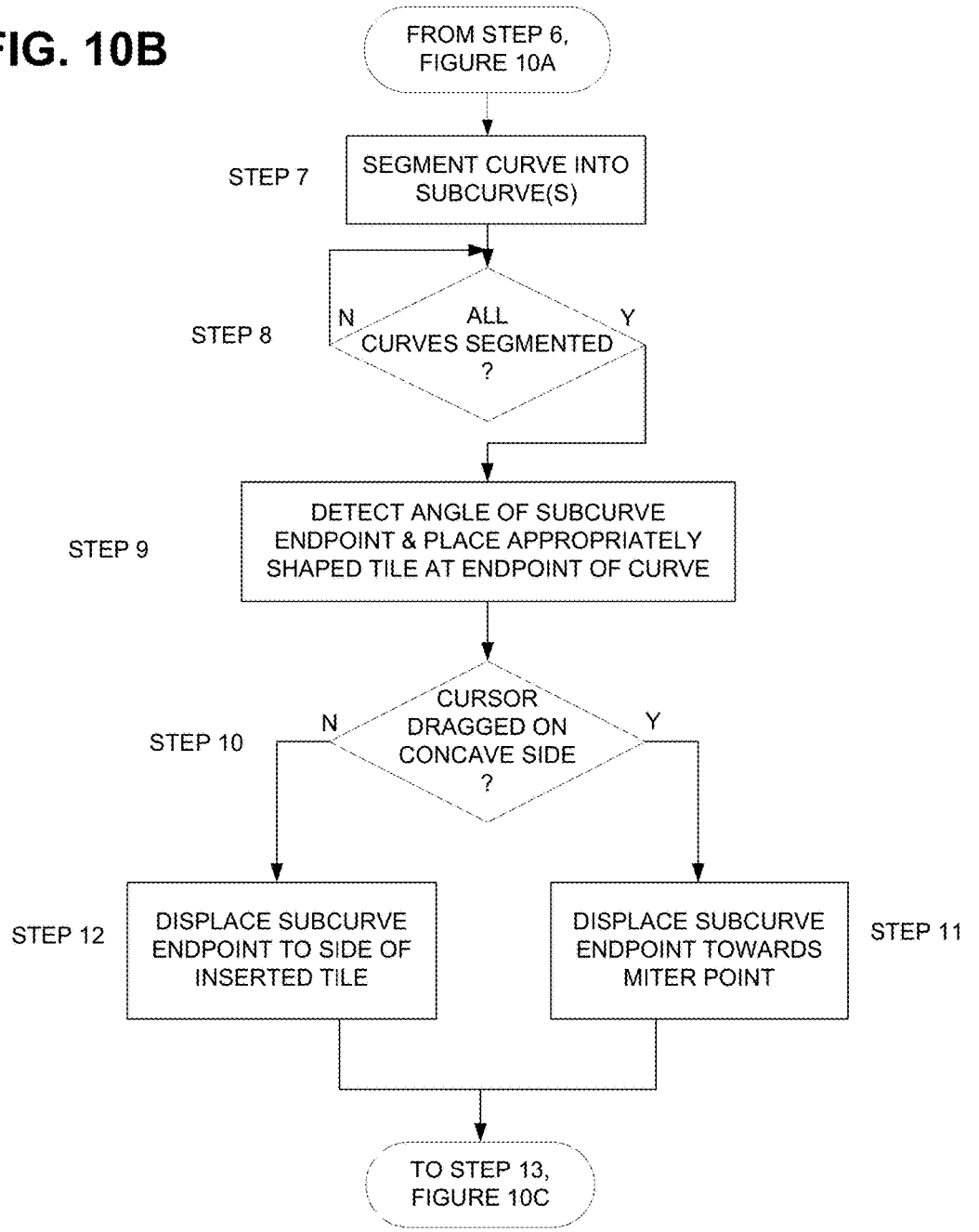

Referring now to FIG. 10B, in Step 7 each curve (region boundary, feature or offset) that is identified to have a sharp angle or corner is segmented into a number of subcurves. The number of segments can be selected by the artist or can be of a standard pre-selected length programmed into the plugin module. Regardless, if in Step 8 it is determined that all curves identified to have sharp angles are segmented, then the process proceeds to Step 9 where the degree of the subcurve angle is detected and an appropriately shaped tile is placed at the vertex of the angle or the curve endpoint. Then in Step 10, the plugin determines whether the cursor is moving on the concave side of the subcurve or not, and is so the process proceeds to Step 11, otherwise the process proceeds to Step 12. In Step 11, the endpoint of the subcurve is moved toward a miter point of the subcurve, and in Step 12 the endpoint of the subcurve is moved to be next to the side of the inserted tile. At this point, the process proceeds to Step 13 in FIG. 10C.

Figure 10C:
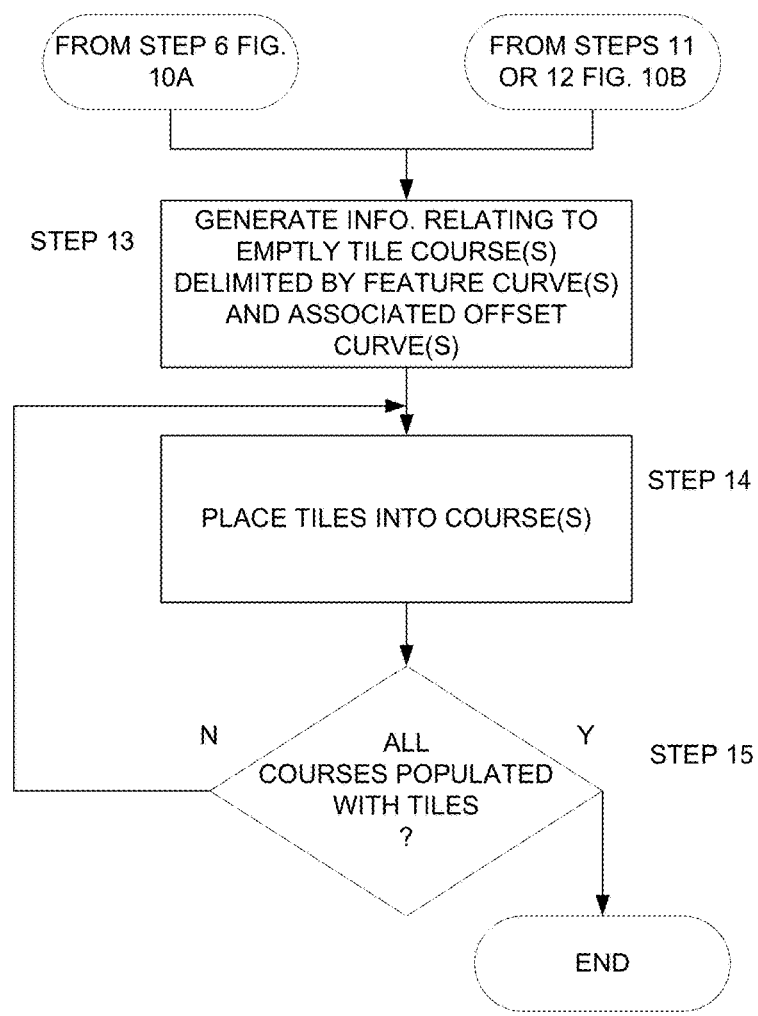

Referring now to FIG. 10C, in Step 13, information relating to the geometry and position of an empty tile course is generated and stored in the buffer (FIG. 1F) where it can be accessed by the graphical processor and displayed to be viewed by the artist. In Step 14, the plugin can populate each course with tiles and adjust the tile dimensions to eliminate any partial tiles at the end of a course, and if in Step 15 it is determined that all courses have been populated with tiles, then the process can be terminated, otherwise the process can loop between Step 14 and 15 until all courses are populated with tiles. It should be understood, that all of the curve and tile position information stored in the buffer comprising the System 10 can be accessed by the graphical processor and displayed for viewing by the artist at any point in the process. The System 10 allows the artist to easily deselect one or more curves, and to select new curves and to generate new tiled courses in order to interactively manipulate the appearance of a mosaic design in a manner that virtually replicates a manual design process.

The forgoing description, for purposes of explanation, used specific nomenclature to provide a thorough understanding of the invention. However, it will be apparent to one skilled in the art that specific details are not required in order to practice the invention. Thus, the forgoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described in order to best explain the principles of the invention and its practical applications, they thereby enable others skilled in the art to best utilize the invention and various embodiments with various modifications as are suited to the particular use contemplated. It is intended that the following claims and their equivalents define the scope of the invention.

We claim:

1. A method for determining the position of a plurality of tiles in a mosaic design, comprising:
    partitioning the mosaic design into one or more closed regions of interest by entering region boundary information into a mosaic design system, and entering a dimension of a tile and a grout line width to be placed into the mosaic design, the one or more closed regions comprised of a plurality of feature curves;
    identifying, by a mosaic design system, at least one high curvature point along any one of the plurality of the feature curves, and partitioning the feature curve at this high curvature point into a first and a second subcurve, the high curvature point representing an abrupt change in direction between two adjacent segments comprising the feature curve having an angle greater than a selected threshold angle, and determining that the angle at the high curvature point corresponds to a first one of a plurality of high curvature point categories, each category having a different mosaic tile geometry;
    resampling at least the first subcurve, in an adaptive manner that depends upon a degree of curvature, to determine a position for each of a plurality of tiles along the first subcurve, to include the high curvature point, the plurality of the tiles having one dimension that is smaller than the tile dimension entered by the mosaic artist, and a mosaic tile geometry at the high curvature point along the first subcurve corresponds to the mosaic tile geometry of the first one of the plurality of high curvature point categories; and
    displaying each of the plurality of the tiles along the first subcurve in the positions determined by the mosaic tile design system by the mosaic artist selecting at least a portion of a displayed graphical representation of the first subcurve having the high curvature point and moving a cursor in a direction away from the subcurve while it is selected.

2. The method of claim 1, wherein the adaptive resampling of the first subcurve identifies the position of vertices along the subcurve, and the position of the vertices corresponds to tile edge placement along the subcurve.

3. The method of claim 2, wherein the adaptive resampling operates to resample the subcurve at regular intervals, and the distance between adjacent vertices is multiplied by a weight that is selected according to the local degree of curvature of the subcurve.

4. The method of claim 2, wherein the adaptive resampling operates to resample the subcurve at irregular intervals to randomly vary the position of the vertices along the feature curve.

5. The method of claim 1, wherein the high curvature point is associated with one of a plurality of high curvature categories, and each high curvature category corresponds to a different range of angles formed by the abrupt change in direction between two adjacent segments comprising the feature curve.

6. The method of claim 5, wherein each high curvature category is associated with an appropriately shaped tile for placement at the high curvature point of the feature curve.

7. The method of claim 1, wherein the mosaic design system calculates an optimized tile dimension that differs from the tile dimension entered by the mosaic artist is the tiled course ends in a partial tile.

8. The method of claim 1, wherein the region boundary information corresponds to straight lines or curved lines.

9. The method of claim 1, wherein the feature curve information corresponds to straight lines or curved lines that are partially or fully within the region or along the region boundary.

10. A mosaic design system comprising:
    a display, a special purpose computer application and graphical processing module running on a computational device having computer memory that operates to receive and display mosaic design feature curve information and tile dimension information, and to identify a point along the feature curve having high curvature that is represented by an abrupt change in direction between two adjacent segments comprising the feature curve, partitioning the feature curve at the high curvature point into a first and a second subcurve and generating a curve offset from either the first or the second subcurve; and
    the graphical processing module displaying each of a plurality of tiles along at least one of the first and second subcurves to a mosaic artist by the mosaic artist selecting the at least one displayed subcurve and moving a cursor in a direction away from the subcurve while it is selected a distance equal to a tile width;
    wherein, the special purpose application further operates to resample at least the first subcurve in an adaptive manner depending upon a degree of curvature to determine a position for each of a plurality of tiles along the subcurve, the plurality of the tiles having one dimension that is smaller than the tile dimension entered by the mosaic artist; and the graphical processing module operating to display each of the plurality of the tiles in a tile course in the position determined by the mosaic tile design system, the tile course being the area between the subcurve and the offset curve.

11. The mosaic design system of claim 10, wherein the feature curve comprises a mosaic design region boundary.

12. The mosaic design system of claim 10, wherein the feature curve is a straight line or a curved line.

13. The mosaic design system of claim 10, wherein the adaptive resampling of the first subcurve identifies the positions of vertices along the subcurve, and the positions of the vertices corresponds to tile edge placement along the subcurve.

14. The mosaic design system of claim 13, wherein the adaptive resampling operates to resample the subcurve at regular intervals, and the distance between adjacent vertices is multiplied by a weight that is selected according to the local degree of curvature of the subcurve.

15. The mosaic design system of claim 14, wherein the adaptive resampling operates to resample the subcurve at irregular intervals to randomly vary the position of the vertices along the feature curve.

16. The mosaic design system of claim 10, wherein the special purpose application determines that the high curvature point is associated with one of a plurality of high curvature categories, and each high curvature category corresponds to a different range of angles formed by the abrupt change in direction between two adjacent segments comprising the feature curve.

* * * * *